United States Patent
Cho et al.

(10) Patent No.: US 7,507,651 B2
(45) Date of Patent: Mar. 24, 2009

(54) METHOD FOR FABRICATING SEMICONDUCTOR DEVICE WITH BULB SHAPED RECESS GATE PATTERN

(75) Inventors: Yong-Tae Cho, Ichon-shi (KR); Suk-Ki Kim, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 299 days.

(21) Appl. No.: 11/411,891

(22) Filed: Apr. 27, 2006

(65) Prior Publication Data

US 2007/0148934 A1      Jun. 28, 2007

(30) Foreign Application Priority Data

Dec. 22, 2005     (KR)  ...................... 10-2005-0127736

(51) Int. Cl.
  *H01L 21/3205* (2006.01)
  *H01L 21/4763* (2006.01)
(52) U.S. Cl. ............... 438/585; 438/270; 257/E21.621; 257/E21.252
(58) Field of Classification Search ................ 438/585, 438/279, 270, 589; 257/E21.621, E21.428, 257/E21.618, E21.655, E21.252
See application file for complete search history.

(56) References Cited

U.S. PATENT DOCUMENTS

| | | | |
|---|---|---|---|
| 4,763,179 A | 8/1988 | Tsubouchi et al. | |
| 7,247,540 B2* | 7/2007 | Chung et al. | 438/279 |
| 2006/0113590 A1* | 6/2006 | Kim et al. | 257/330 |
| 2006/0237817 A1* | 10/2006 | Park | 257/500 |
| 2006/0246730 A1* | 11/2006 | Kim et al. | 438/700 |
| 2007/0042583 A1* | 2/2007 | Jang et al. | 438/585 |
| 2007/0099383 A1* | 5/2007 | Han et al. | 438/270 |
| 2007/0099384 A1* | 5/2007 | Han et al. | 438/270 |
| 2007/0111469 A1* | 5/2007 | Kim et al. | 438/424 |
| 2007/0123014 A1* | 5/2007 | Han et al. | 438/585 |
| 2007/0148934 A1* | 6/2007 | Cho et al. | 438/585 |
| 2007/0155148 A1* | 7/2007 | Kim | 438/589 |
| 2007/0232041 A1* | 10/2007 | Choi et al. | 438/585 |
| 2007/0295995 A1* | 12/2007 | Yun et al. | 257/202 |
| 2008/0160737 A1* | 7/2008 | Oh et al. | 438/585 |

FOREIGN PATENT DOCUMENTS

| | | |
|---|---|---|
| JP | 2001-244325 | 9/2001 |
| JP | 2003-007676 | 1/2003 |

* cited by examiner

*Primary Examiner*—Walter L Lindsay, Jr.
(74) *Attorney, Agent, or Firm*—Finnegan, Henderson, Farabow, Garrett, & Dunner, L.L.P.

(57) ABSTRACT

A method for fabricating a semiconductor device with a bulb shaped recess gate pattern includes selectively etching a first portion of a substrate to form a first recess; forming a spacer on sidewalls of the first recess; performing an isotropic etching process on a second portion of the substrate beneath the first recess to form a second recess, the second recess being wider and more rounded than the first recess; removing the spacer; and forming a gate pattern having a first portion buried into the first and second recesses and a second portion projecting over the substrate.

16 Claims, 6 Drawing Sheets

400

500

METHOD FOR FABRICATING SEMICONDUCTOR DEVICE WITH BULB SHAPED RECESS GATE PATTERN

RELATED APPLICATION

This application is based upon and claims the benefit of priority from the prior Korean Patent Application No. 10-2005-0127736, filed Dec. 22, 2005, the entire contents of which are incorporated herein by reference.

TECHNICAL FIELD

The present invention relates to a method for fabricating a semiconductor device; and more particularly, to a method for fabricating a semiconductor device with a bulb shaped recess gate pattern.

DESCRIPTION OF RELATED ARTS

As semiconductor devices became more highly integrated, a conventional planar type gate interconnection line including a gate pattern formed over a flat active region results in a short gate channel length and high ion-implantation concentration. Accordingly, junction leakage is generated due to an increased electric field and thus, the semiconductor device has a poor refresh property.

To alleviate the above problem associated with a conventional planar type gate interconnection line, a process has been implemented to form a recess gate pattern in an etched active region of a substrate. The recess gate pattern process increases a channel length and reduces an ion-implantation concentration, thereby improving a refresh property of the semiconductor device.

Furthermore, because a length of the recess gate pattern cannot decrease infinitely to satisfy the continuous demand for higher integration of semiconductor devices, a bulb shaped recess gate pattern with a wide and rounded lower portion thereof has been suggested to further improve a refresh property.

FIGS. 1 and 2 are micrographic images of transmission electron microscopy (TEM) illustrating a conventional semiconductor device with a bulb shaped recess gate pattern.

In FIG. 1, an abnormal phenomenon in the bulb shaped recess gate pattern formed on a substrate is illustrated.

An isotropic etching process is performed using a plasma obtained by mixing $CF_x$, and $CHF_x$, with oxygen gas to form the bulb shaped recess gate pattern. During the etching process, because of a low etch selectivity ratio between silicon and an oxide layer, the substrate becomes very sensitive to a chamber condition and a surface thereof may be damaged. As a result, the bulb shaped recess gate pattern may be unstable.

FIG. 2 illustrates a damaged top 100 and a damaged side 200 of the bulb shaped recess gate pattern, and an abnormal bulb formation 300.

Similar to FIG. 1, an isotropic etching process is performed using a plasma obtained by mixing $CF_x$ and $CHF_x$ with oxygen gas to form the bulb shaped recess gate pattern. The damages and abnormality of the bulb shaped recess gate pattern illustrated in FIG. 2 are due to a low etch selectivity ratio between silicon and an oxide layer.

SUMMARY

Consistent with embodiments of the present invention, there is provided a method for fabricating a semiconductor device with a bulb shaped recess gate pattern with reduced damages to a top and a side thereof and with reduced abnormality by increasing an etch selectivity between an oxide layer and silicon.

Consistent with embodiments of the present invention, there is provided a method for fabricating a semiconductor device, including selectively etching a first portion of a substrate to form a first recess; forming a spacer on sidewalls of the first recess; performing an isotropic etching process on a second portion of the substrate beneath the first recess to form a second recess, the second recess being wider and more rounded than the first recess; removing the spacer; and forming a gate pattern having a first portion buried into the first and second recesses and a second portion projecting over the substrate.

Additional features and advantages of the invention will be set forth in part in the description which follows, and in part will be apparent from that description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The above and other features will become better understood with respect to the following description of the preferred embodiments given in conjunction with the accompanying drawings, in which.

DETAILED DESCRIPTION

Herein after, detailed descriptions of certain embodiments consistent with the present invention will be provided with reference to the accompanying drawings.

FIGS. 3A to 3E are cross-sectional views illustrating a method for fabricating a bulb shaped recess gate pattern consistent with embodiments of the present invention.

Figure 1:
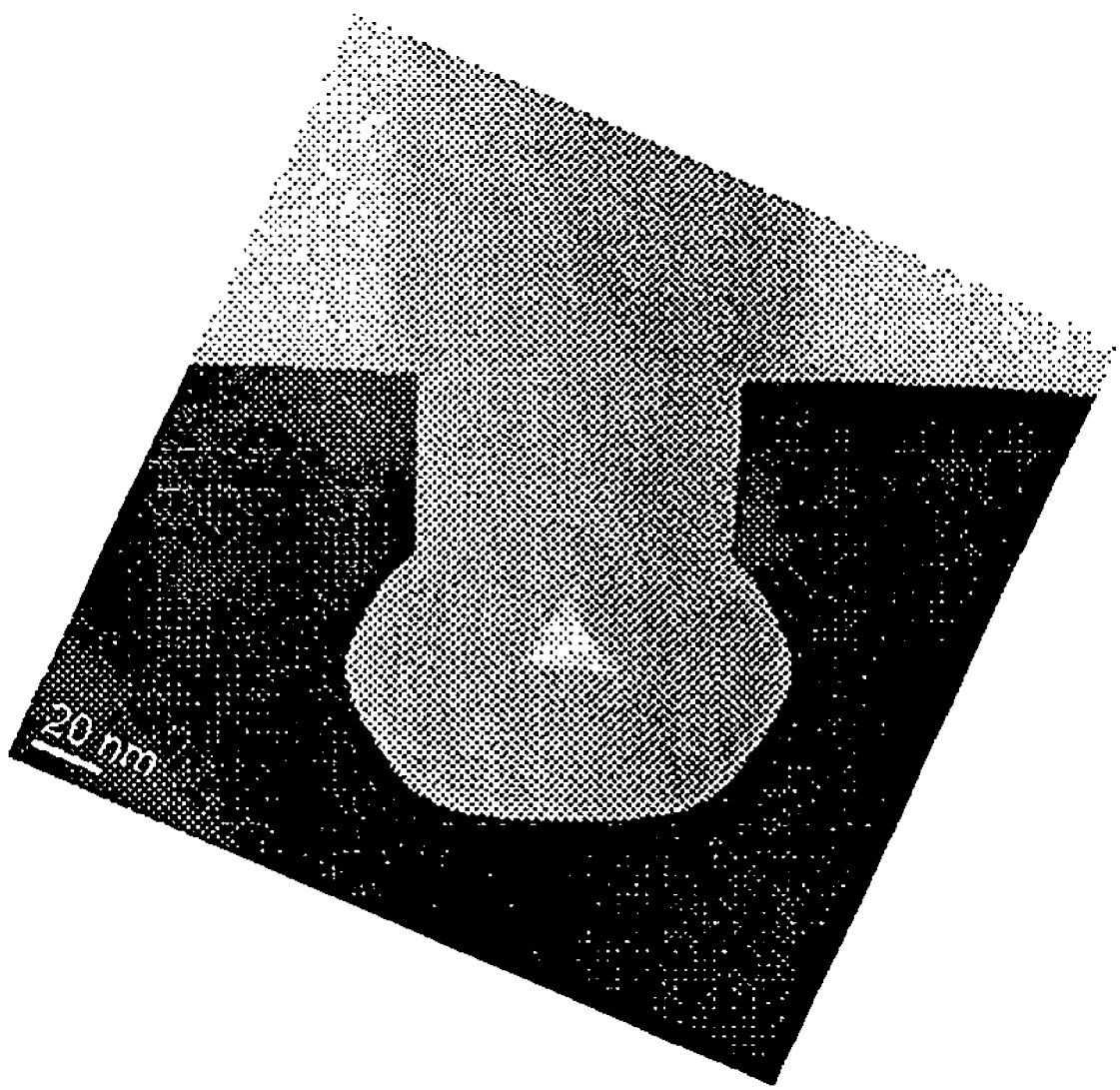
FIGS. 1 and 2 are micrographic images of transmission electron microscopy (TEM) illustrating a conventional semiconductor device with a bulb shaped recess gate pattern.
Figure 2:
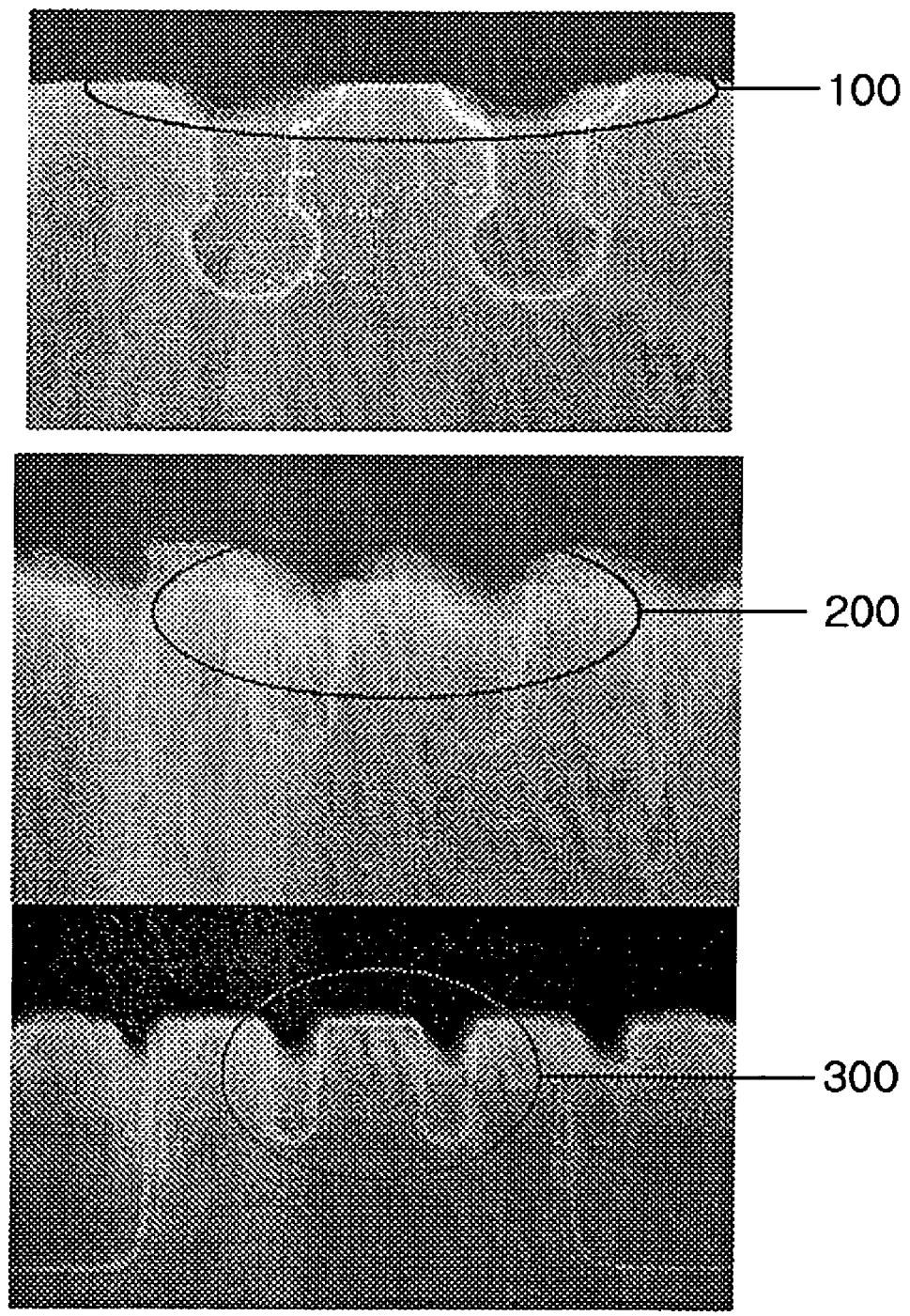
Figure 3A:
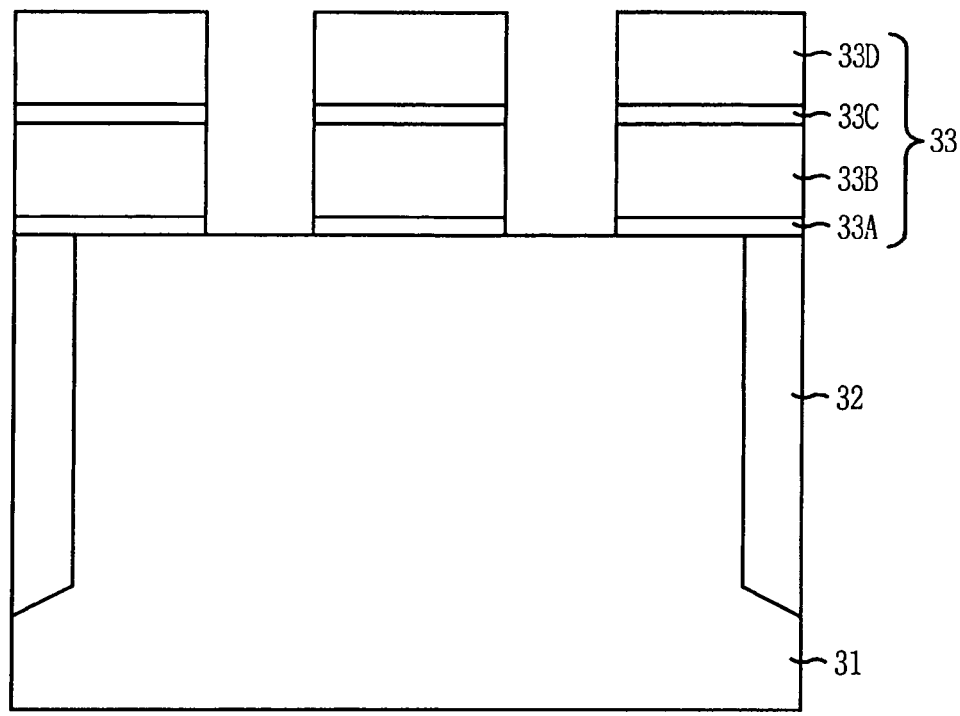
FIGS. 3A to 3E are cross-sectional views illustrating a method for fabricating a semiconductor device with a bulb shaped recess gate pattern consistent with the present invention.

As shown in FIG. 3A, a plurality of device isolation layers 32 are formed in a substrate 31 through a shallow trench isolation (STI) process. Herein, the device isolation layers 32 are formed to define an active region and thus, the device isolation layers 32 have a greater depth than a recess gate pattern subsequently formed.

To form the device isolation layers 32, predetermined portions of the substrate 31 are etched, thereby forming trenches. Insulation layers are buried into the trenches and polished through a chemical mechanical polishing (CMP) process to form the device isolation layers 32.

Subsequently, a plurality of mask patterns 33 are formed over the substrate 31 including the device isolation layers 32. Herein, each of the mask patterns 33 is formed by sequentially stacking a patterned sacrificial oxide layer 33A, a patterned hard mask 33B, a patterned anti-reflective coating layer 33C, and a patterned photoresist layer 33D. Although not shown, processes of forming the patterned sacrificial oxide layer 33A, the patterned hard mask 33B, the patterned anti-reflective coating layer 33C, and the patterned photoresist layer 33D are explained. First, a sacrificial oxide layer is formed over the substrate 31 including the device isolation layers 32. The sacrificial oxide layer can be a pad oxide layer used during the device isolation layer formation process. Then, a hard mask is formed over the sacrificial oxide layer. The hard mask comprises silicon and serves to secure a margin of a photoresist layer during a subsequent etching process. Next, an anti-reflective coating layer and a photoresist layer are sequentially formed over the hard mask. Afterwards, the photoresist layer is patterned through a photo-exposure process and a developing process. Next, the anti-reflective layer, the hard mask, and the sacrificial oxide layer are patterned using the patterned photoresist layers 33D as an etch mask. As a result, the mask patterns 33 including the patterned sacrificial oxide layer 33A, the patterned hard mask 33B, the patterned anti-reflective coating layers 33C, and the patterned photoresist layers 33D are formed.

Figure 3B:
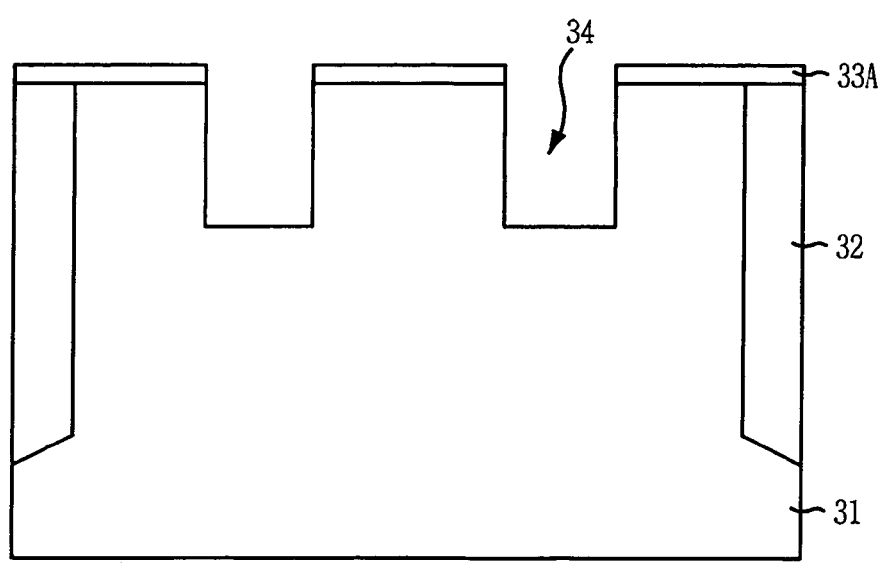

As shown in FIG. 3B, predetermined portions of the substrate 31 are etched using the mask patterns 33 as an etch mask, thereby forming a plurality of first recesses 34 with a vertical profile. When the first recesses 34 are formed, most portions of the mask patterns 33 except the patterned sacrificial oxide layers 33A are removed.

Figure 3C:
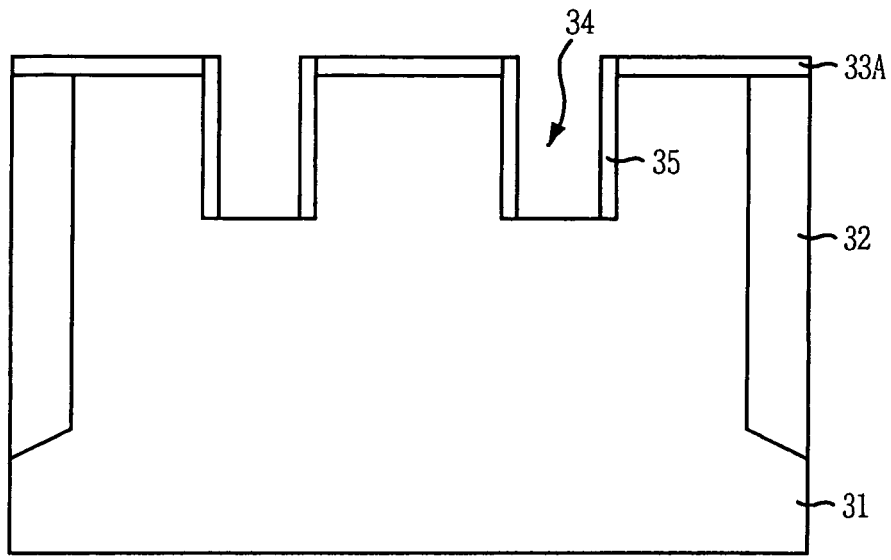

As shown in FIG. 3C, a plurality of spacers 35 are formed on sidewalls of the first recesses 34 to a thickness ranging from approximately 50 Å to approximately 100 Å. The spacers 35, along with the patterned sacrificial oxide layers 33A, prevent damages to the substrate 31 during a subsequent etching process for forming a second recess. The spacers 35 comprise an oxide formed at a medium temperature ranging from approximately 500° C. to approximately 700° C.

Figure 3D:
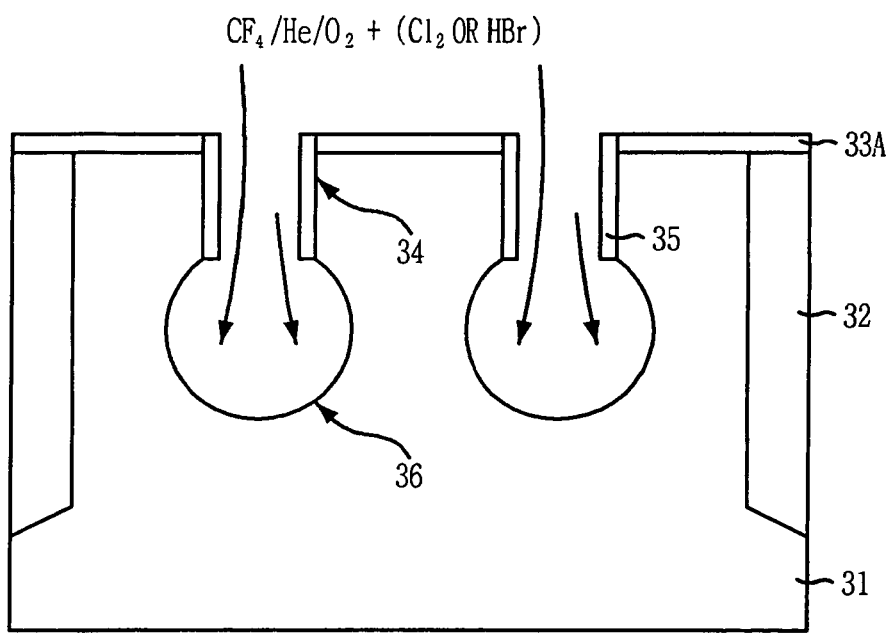

As shown in FIG. 3D, the substrate 31 beneath the first recesses 34 is etched to form a plurality of second recesses 36. The second recesses 36 are formed through an isotropic etching process in the same chamber where the first recesses 34 are formed. That is, the first recesses 34 and the second recesses 36 are formed in-situ. Also as FIG. 3D shows, the second recesses 36 are wider and more rounded than the first recesses 34.

The second recesses 36 may be formed by etching the substrate 31 in one apparatus selected from the group consisting of an inductively coupled plasma (ICP) reactor, a transformer coupled plasma (TCP) reactor, a microwave down stream (MDS) plasma reactor, an electron cyclotron resonance (ECR) plasma reactor, and a helical type plasma reactor, with a pressure ranging from approximately 20 mTorr to approximately 100 mTorr, a top power ranging from approximately 500 W to approximately 1,500 W, and without a bottom power.

The etching of the substrate 31 for forming the second recesses 36 may use a plasma including tetrafluoromethane ($CF_4$) gas, helium (He) gas and oxygen ($O_2$) gas as a main gas and, in addition, chlorine ($Cl_2$) gas or hydrogen bromide (HBr) gas. The addition of chlorine ($Cl_2$) gas or hydrogen bromide (HBr) results in a high etch selectivity between the substrate 31 which comprises silicon and the spacers 35 which comprise oxide. A flow rate of the $CF_4$ gas is approximately 30 sccm to approximately 80 sccm, a flow rate of the He gas is approximately 50 sccm to approximately 300 sccm, and a flow rate of the $O_2$ gas is approximately 10 sccm to approximately 50 sccm. A flow rate of the additional gas such as $Cl_2$ or HBr is approximately one fifth to approximately one third of the flow rate of the $CF_4$ gas. For example, the flow rate of the additional gas is approximately 6 sccm to approximately 27 sccm.

With the additional gas such as $Cl_2$ or HBr, a high etch selectivity between oxide layer and silicon is achieved during the etching of the substrate 31 for forming the second recesses 36. Thus, it becomes possible to secure uniformity in a bulb formation without damage to either internal or external sides of a recess pattern. It is also possible to extend a channel length by forming the second recesses 36 which are wider and more rounded than the first recesses 34.

Subsequently, although not shown, a plasma oxidation process is performed using a chemical dry etching (CDE) method. To perform the plasma oxidation process, an ICP type apparatus with a faraday field is used with supply of a power ranging from approximately 300 W to approximately 3,000 W. Also, the plasma oxidation process is performed using a plasma including $CF_4$ gas, He gas and $O_2$ gas. The $CF_4$ gas, the He gas and the $O_2$ gas are mixed in a ratio of approximately 12 to 100 to 30. Particularly, the plasma oxidation process is performed to oxidize the substrate 31 to a thickness of approximately 50 Å.

Hereinafter, recesses including the first recesses 34 and the second recesses 36 are referred to as recesses R.

Figure 3E:
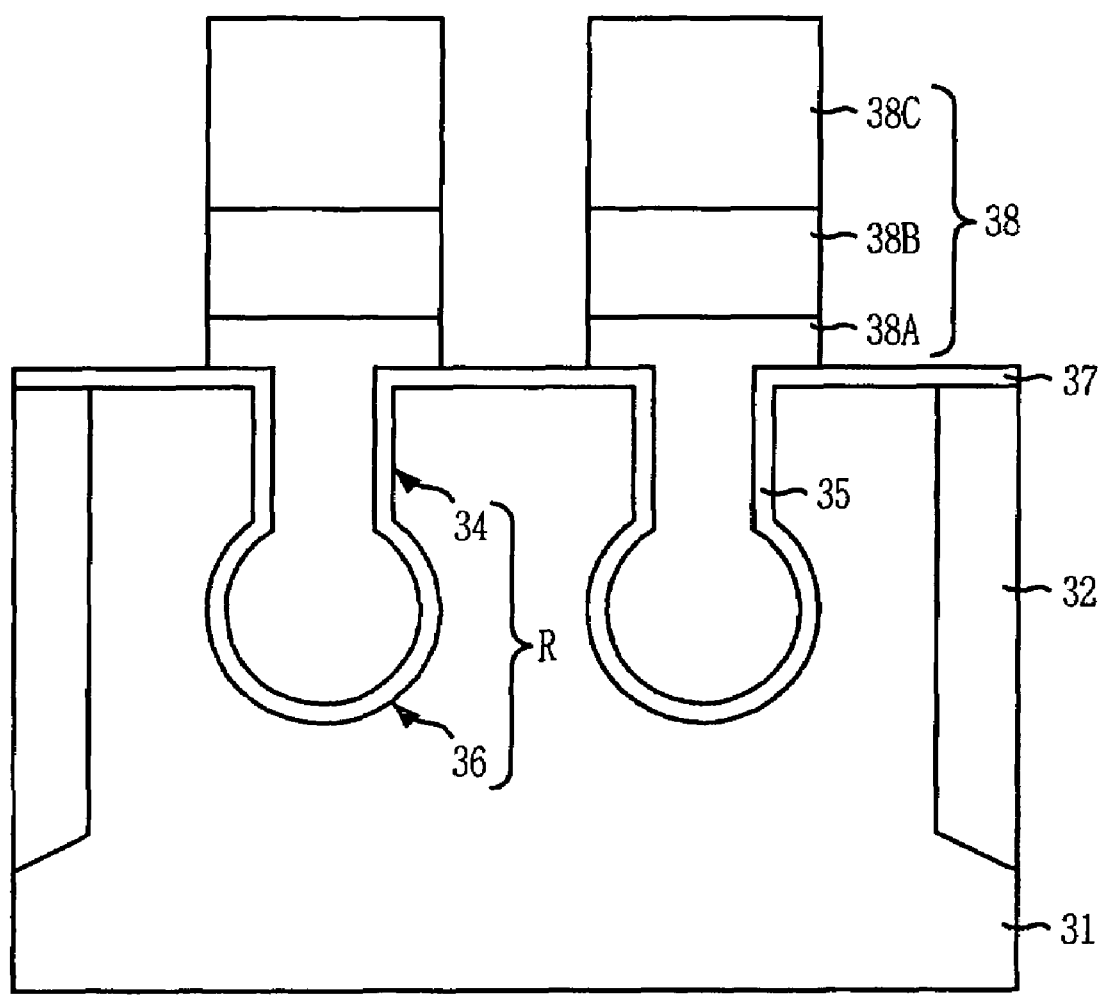

As shown in FIG. 3E, a wet cleaning process is performed. Herein, the wet cleaning process is performed by using a solution of hydrogen fluoride (HF) or buffered oxide etchant (BOE) to remove the patterned sacrificial oxide layer 33A, the spacers 35 which comprises an oxide, and an etch residue.

Next, a gate insulation layer 37 is formed over the substrate 31 including the recesses R. Next, a plurality of gate patterns 38 are formed with first portions thereof buried in the recesses R and second portions thereof projecting over the substrate 31. Herein, each of the gate patterns 38 is formed by sequentially stacking a polysilicon layer 38A, a gate electrode 38B, and a gate hard mask 38C.

Figure 4:
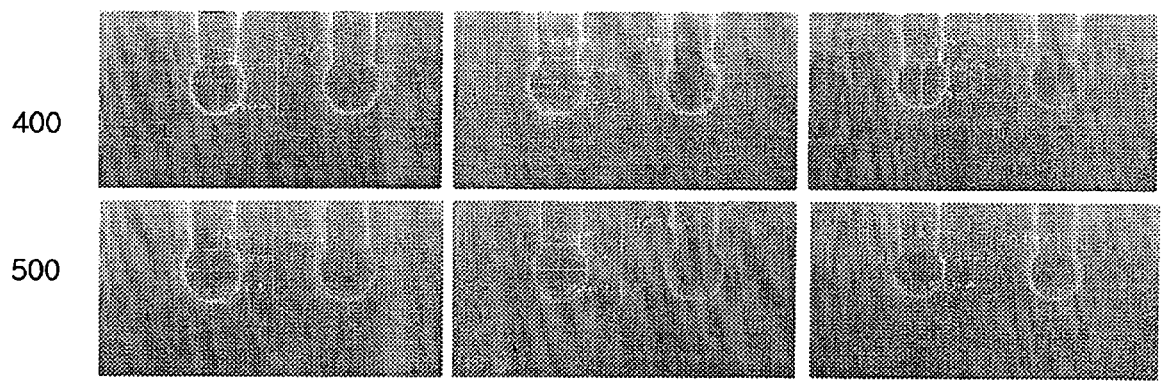
FIG. 4 is a micrographic image of TEM illustrating a semiconductor device with a bulb shaped recess gate pattern consistent with the present invention.

FIG. 4 is a micrographic image of transmission electron microscopy (TEM) illustrating semiconductor devices with bulb shaped recess gate patterns consistent with embodiments of the present invention.

FIG. 4 illustrates bulb shaped recess gate patterns formed by etching a silicon substrate with a plasma including $Cl_2$ gas or HBr gas, which results in a high etch selectivity between an oxide layer and silicon. First bulb shaped recess gate patterns 400 are formed by etching the silicon substrate with a plasma including $Cl_2$ gas with a flow rate of approximately 10 sccm, and second bulb shaped recess gate patterns 500 are formed by etching the silicon substrate with a plasma including HBr gas with a flow rate of approximately 10 sccm. First bulb shaped recess gate patterns 400 and second bulb shaped recess gate patterns 500 have a uniform profile.

Consistent with the present invention, it is possible to increase etch selectivity between silicon and an oxide layer by using a plasma including $Cl_2$ gas or HBr gas. Consequently, problems of damage to the top and side of a recess gate pattern and possible abnormality of the recess gate pattern are alleviated or avoided.

As described above, the method for fabricating a semiconductor device with the bulb shaped recess gate pattern consistent with the present invention achieves a high etch selectivity between silicon and an oxide layer during an etching for forming the recess gate pattern and makes it possible to secure uniformity in a bulb formation without causing any damages to internal and external sides of the recess gate pattern. Thus, a channel length of the recess gate pattern can be increased and an ion-implantation concentration can be decreased. Accordingly, a refresh property of the device can be greatly improved, thereby improving a design rule and maximizing a process margin. The method for fabricating the semiconductor device with the bulb shaped recess gate pattern consistent with embodiments of the present invention also allows for an increased scale of integration of semiconductor devices, improved yields of production, and decreased production costs.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for fabricating a semiconductor device, comprising:
    selectively etching a first portion of a substrate to form a first recess;
    forming a spacer on sidewalls of the first recess;
    performing an isotropic etching process to etch a second portion of the substrate beneath the first recess to form a second recess, the second recess being wider than the first recess;
    performing a plasma oxidation process on a resultant structure including the second recess;
    removing the spacer; and
    forming a gate pattern having a first portion buried in the first and second recesses and a second portion projecting over the substrate.

2. The method of claim 1, wherein performing the isotropic etching process comprises etching the second portion of the substrate using a plasma including a gas providing a high etch selectivity between the substrate and the spacer.

3. The method of claim 1, wherein performing the isotropic etching process comprises etching the second portion of the substrate with a mixture of $CF_4$ gas, He gas, and $O_2$ gas as a main gas, and a gas providing a high etch selectivity between the substrate and the spacer.

4. The method of claim 3, wherein the gas providing the high etch selectivity comprises one of $Cl_2$ gas and HBr gas.

5. The method of claim 3, wherein a flow rate of the $CF_4$ gas in the mixture is approximately 30 sccm to approximately 80 sccm, a flow rate of the He gas in the mixture is approximately 50 sccm to approximately 300 sccm, and a flow rate of the $O_2$ gas in the mixture is approximately 10 sccm to approximately 50 sccm.

6. The method of claim 4, wherein the gas providing the high etch selectivity has a flow rate approximately one fifth to approximately one third of a flow rate of the $CF_4$ gas.

7. The method of claim 6, wherein the gas providing the high etch selectivity has a flow rate ranging from approximately 6 sccm to approximately 27 sccm.

8. The method of claim 7, wherein performing the isotropic etching process comprises etching the second portion of the substrate in one apparatus selected from a group consisting of a transformer coupled plasma (TCP) plasma reactor, an inductivity coupled plasma (ICP) reactor, a microwave down stream (MDS) plasma reactor, an electron cyclotron resonance (ECR) plasma reactor, and a helical type plasma reactor.

9. The method of claim 8, wherein performing the isotropic etching process comprises etching the second portion of the substrate with a pressure ranging from approximately 20 mTorr to approximately 100 mTorr and a source power ranging from approximately 500 W to approximately 1,500 W.

10. The method of claim 1, wherein selectively etching the first portion of the substrate and performing the isotropic etching process are performed in-situ in the same chamber.

11. The method of claim 1, wherein the spacer comprises an oxide.

12. The method of claim 11, wherein the spacer is formed on the sidewalls of the first recess to a thickness ranging from approximately 50 Å to approximately 100 Å and at a temperature ranging from approximately 500° C. to approximately 700° C.

13. The method of claim 1, wherein performing the plasma oxidation process comprises performing a chemical dry etching (CDE) using a gas mixture including $CF_4$ gas, He gas, and $O_2$ gas mixed in a ratio of approximately 12 to 100 to 30.

14. The method of claim 13, wherein performing the plasma oxidation process comprises oxidizing the substrate to a thickness of approximately 50 Å.

15. The method of claim 1, wherein removing the spacer comprises performing a wet etching process.

16. The method of claim 15, wherein performing the wet etching process comprises performing the wet etching process using one of a solution of hydrogen fluoride (HF) and buffered oxide etchant (BOE).

* * * * *